US009343114B2

(12) United States Patent
Housley

(10) Patent No.: US 9,343,114 B2
(45) Date of Patent: *May 17, 2016

(54) MEMORY ARRAYS AND METHODS OF FORMING ELECTRICAL CONTACTS

(71) Applicant: Micron Technology, Inc., Boise, ID (US)

(72) Inventor: Richard T. Housley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 90 days.

This patent is subject to a terminal disclaimer.

(21) Appl. No.: 14/308,584

(22) Filed: Jun. 18, 2014

(65) Prior Publication Data

US 2014/0301126 A1 Oct. 9, 2014

Related U.S. Application Data

(60) Continuation of application No. 13/857,855, filed on Apr. 5, 2013, now Pat. No. 8,796,786, which is a division of application No. 13/029,042, filed on Feb. 16, 2011, now Pat. No. 8,435,859.

(51) Int. Cl.
*H01L 21/70* (2006.01)
*G11C 5/06* (2006.01)
*H01L 27/108* (2006.01)
*H01L 21/74* (2006.01)
*H01L 27/088* (2006.01)
*H01L 29/66* (2006.01)

(52) U.S. Cl.
CPC ............... *G11C 5/06* (2013.01); *H01L 21/743* (2013.01); *H01L 27/088* (2013.01); *H01L 27/10891* (2013.01); *H01L 27/10894* (2013.01); *H01L 29/66666* (2013.01)

(58) Field of Classification Search
CPC ............ H01L 29/66795; H01L 23/528; H01L 23/5226; H01L 21/768; H01L 27/0924; H01L 27/1211; H01L 27/0207; H01L 27/11556; H01L 29/41791; H01L 29/66666
See application file for complete search history.

(56) References Cited

U.S. PATENT DOCUMENTS

| 5,930,640 | A | 7/1999 | Kenney |
| 6,914,286 | B2 | 7/2005 | Park |
| 6,958,513 | B2 | 10/2005 | Wang |
| 7,569,876 | B2 | 8/2009 | Forbes |
| 7,816,728 | B2 | 10/2010 | Ho et al. |
| 8,097,910 | B2 | 1/2012 | Juengling |
| 2011/0215408 | A1* | 9/2011 | Tang ..................... H01L 21/845 257/348 |
| 2011/0241098 | A1* | 10/2011 | Park .................. H01L 27/11565 257/324 |

* cited by examiner

Primary Examiner — David Vu
Assistant Examiner — Cuong Nguyen
(74) Attorney, Agent, or Firm — Wells St. John P.S.

(57) ABSTRACT

Some embodiments include methods of forming electrical contacts. A row of semiconductor material projections may be formed, with the semiconductor material projections containing repeating components of an array, and with a terminal semiconductor projection of the row comprising a contact location. An electrically conductive line may be along said row, with the line wrapping around an end of said terminal semiconductor projection and bifurcating into two branches that are along opposing sides of the semiconductor material projections. Some of the semiconductor material of the terminal semiconductor projection may be replaced with dielectric material, and then an opening may be extended into the dielectric material. An electrical contact may be formed within the opening and directly against at least one of the branches. Some embodiments include memory arrays.

8 Claims, 17 Drawing Sheets

MEMORY ARRAYS AND METHODS OF FORMING ELECTRICAL CONTACTS

RELATED PATENT DATA

This patent resulted from a continuation of U.S. patent application Ser. No. 13/857,855, which was filed Apr. 5, 2013, which issued as U.S. Pat. No. 8,796,786, and which is hereby incorporated herein by reference; which resulted from a divisional of U.S. patent application Ser. No. 13/029,042, which was filed Feb. 16, 2011, which is now U.S. Pat. No. 8,435,859, and which is hereby incorporated herein by reference.

TECHNICAL FIELD

Memory arrays and methods of forming electrical contacts.

BACKGROUND

Memory is one type of integrated circuitry, and is used in computer systems for storing data. Integrated memory is usually fabricated in one or more arrays of individual memory cells.

A memory array will often comprise a first series of conductive lines extending along a first direction, and a second series of conductive lines extending along a second direction that intersects the first direction. One of the first and second series of lines will correspond to access lines (for instance, wordlines), and the other will correspond to sense lines (for instance, bitlines). Each of the memory cells may be uniquely addressed by the combination of an access line and a sense line, and such unique addressing may be utilized during reading and writing operations associated with the individual memory cells.

The access lines and sense lines are connected to other circuitry external of the memory array, and such other circuitry may be utilized to control current flow through the access lines and sense lines during operation of the memory array.

Difficulties may be encountered in forming electrical contacts to the access lines and sense lines for interconnecting the access lines and sense lines to the circuitry external of the memory array. It would be desired to develop new methods for forming electrical contacts to access lines and/or sense lines.

BRIEF DESCRIPTION OF THE DRAWINGS

FIG. 1 is a view from above the construction, FIG. 2 is a cross-sectional view along a horizontal cross-section of the construction, and FIGS. 3-5 are cross-sectional views along vertical cross-sections of the construction. The view of FIG. 1 is from the perspective shown by lines 1-1 of FIGS. 3-5. The cross-section of FIG. 2 is along the lines 2-2 of FIGS. 3-5. The cross-section of FIG. 3 is along the lines 3-3 of FIGS. 1, 2, 4 and 5. The cross-section of FIG. 4 is along the lines 4-4 of FIGS. 1-3. The cross-section of FIG. 5 is along the lines 5-5 of FIGS. 1-3.

FIG. 6 is a view from above analogous to FIG. 1, FIG. 7 is along the same vertical cross-section as FIG. 3, and FIG. 8 is along the same vertical cross-section as FIG. 5. FIG. 6 is from the perspective of lines 6-6 of FIGS. 7 and 8; FIG. 7 is along the lines 7-7 of FIGS. 6 and 8; and FIG. 8 is along the lines 8-8 of FIGS. 6 and 7.

FIG. 9 is along the same horizontal cross-section as FIG. 2, FIG. 10 is along the same vertical cross-section as FIG. 3, and FIG. 11 is along the same vertical cross-section as FIG. 5. FIG. 9 is along the lines 9-9 of FIGS. 10 and 11; FIG. 10 is along the lines 10-10 of FIGS. 9 and 11; and FIG. 11 is along the lines 11-11 of FIGS. 9 and 10.

FIG. 12 is a view from above analogous to FIG. 1, FIG. 13 is along the same vertical cross-section as FIG. 3, and FIG. 14 is along the same vertical cross-section as FIG. 5. FIG. 12 is from the perspective of lines 12-12 of FIGS. 13 and 14; FIG. 13 is along the lines 13-13 of FIGS. 12 and 14; and FIG. 14 is along the lines 14-14 of FIGS. 12 and 13.

FIG. 15 is a view from above analogous to FIG. 1, FIG. 16 is along the same vertical cross-section as FIG. 3, and FIG. 17 is along the same vertical cross-section as FIG. 5. FIG. 15 is from the perspective of lines 15-15 of FIGS. 16 and 17; FIG. 16 is along the lines 16-16 of FIGS. 15 and 17; and FIG. 17 is along the lines 17-17 of FIGS. 15 and 16.

DETAILED DESCRIPTION OF THE ILLUSTRATED EMBODIMENTS

Figure 1:
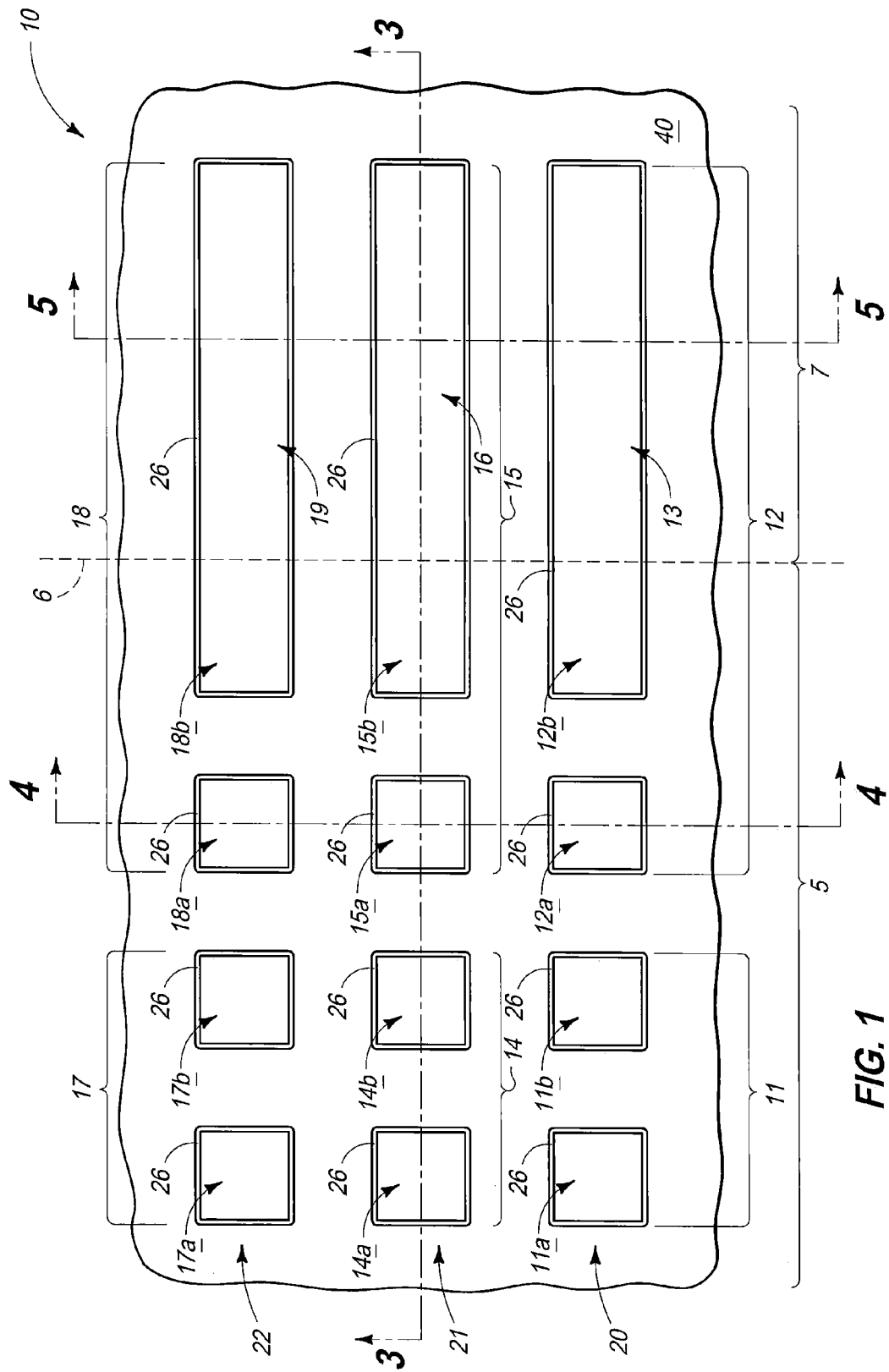
FIGS. 1-5 show multiple views of a portion of a semiconductor construction.

Some embodiments include methods of forming electrical contacts to electrical components of a memory array. For instance, some embodiments include methods of forming electrical contacts to access lines (i.e., wordlines) and/or to sense lines (i.e., bitlines) of a memory array.

An example embodiment is described with reference to FIGS. 1-17.

Referring initially to FIGS. 1-5, a semiconductor construction 10 is illustrated. The construction includes semiconductor material projections 11, 12, 14, 15, 17 and 18 which are arranged in rows 20-22.

Each projection comprises a repeating component of an array. In the shown embodiment, each of the projections 11, 12, 14, 15, 17 and 18 comprises a transistor of a memory array, and thus may be considered to be a transistor projection. The projections 11, 12, 14, 15, 17 and 18 comprise pairs of source/drain regions. The source/drain regions are labeled as 11a, 11b, 12a, 12b, 14a, 14b, 15a, 15b, 17a, 17b, 18a and 18b (for instance, the regions 14a and 14b are associated with the transistor projection 14). The source/drain regions connect to one another through channel regions, with the channel regions 14c and 15c being visible in FIG. 3.

The source/drain regions may be conductively-doped regions formed within the transistor projections 11, 12, 14, 15, 17 and 18.

Figure 3:
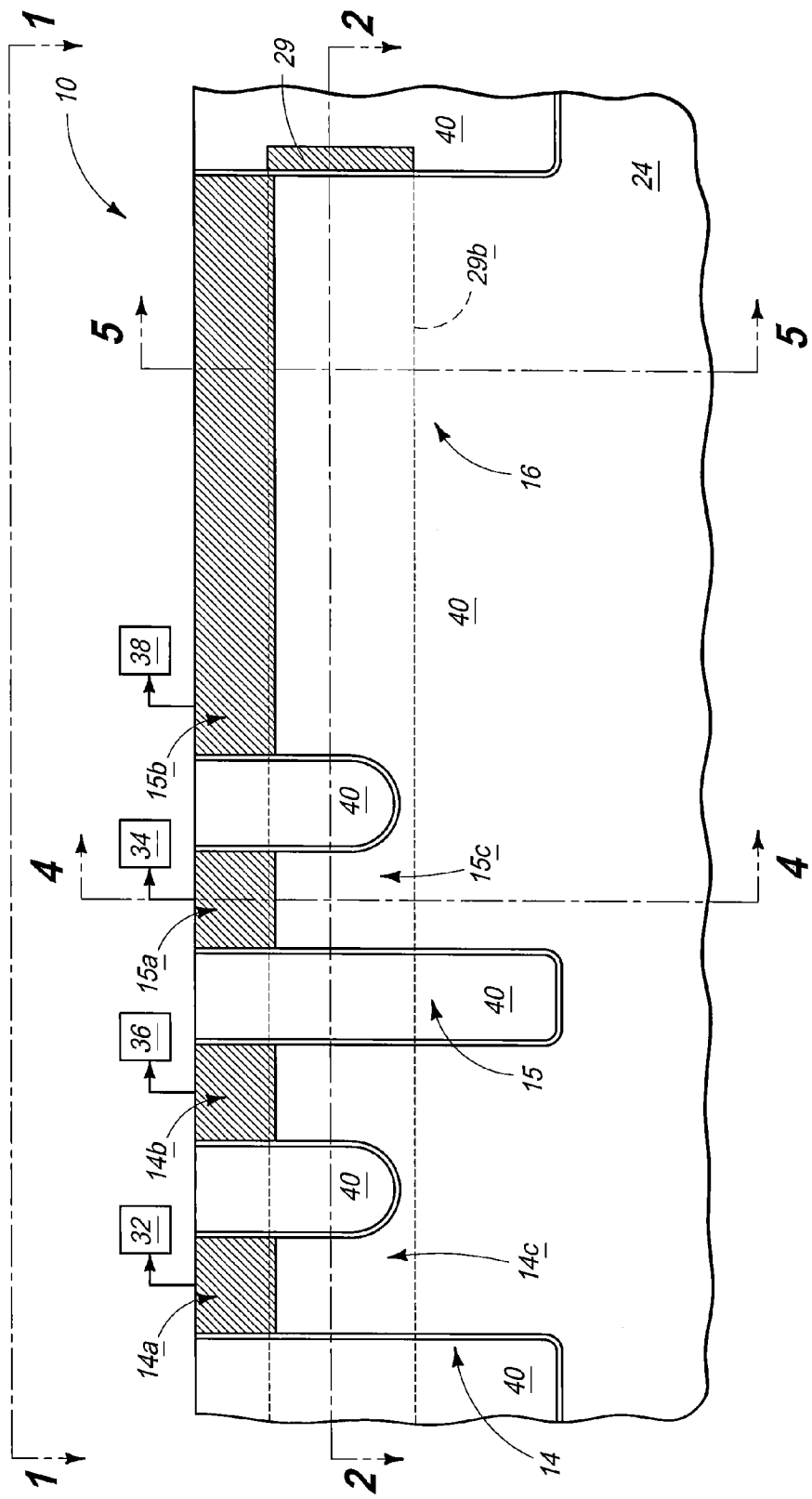

The shown transistor projections have a U-shaped channel region between the source/drain regions (as shown in FIG. 3), but other transistor constructions may be utilized in other embodiments. For instance, the transistor constructions may be vertical pillars in some embodiments such that the source and drain regions are vertically opposed from one another, rather than being in the shown configuration in which they are horizontally opposed from one another.

The transistors of projections 11, 12, 14, 15, 17 and 18 are one example of repeating components of an array that may be formed within semiconductor projections. In other embodiments, other repeating portions of an array may be within the projections either additionally to the transistors, or alternatively to the transistors.

The construction of FIGS. 1-5 may be particularly suitable for forming a dynamic random access memory (DRAM) array, but other arrays may be fabricated in other embodiments. Such other arrays may be, for example, other memory arrays, such as NAND memory arrays.

Each of the rows 20-22 comprises a terminal semiconductor projection (specifically, the projections 12, 15 and 18), and such terminal projections are elongated relative to the non-terminal projections 11, 14 and 17. The illustrated construction is a portion of a semiconductor construction, and typically each row would comprise many more of the non-terminal projections analogous to the projections 11, 14 and 17.

Each of the terminal projections 12, 15 and 18 comprises a segment that is part of a memory array (in the shown embodiment, such segments include the source/drain regions 12a, 12b, 15a, 15b, 18a and 18b), and comprises a segment which is part of a peripheral region where contacts will be formed (the peripheral segments are labeled as 13, 16 and 19). The memory array and peripheral regions are labeled as 5 and 7, respectively, in FIG. 1. A dashed-line 6 is provided to diagrammatically illustrate a boundary between the regions 5 and 7.

Figure 4:
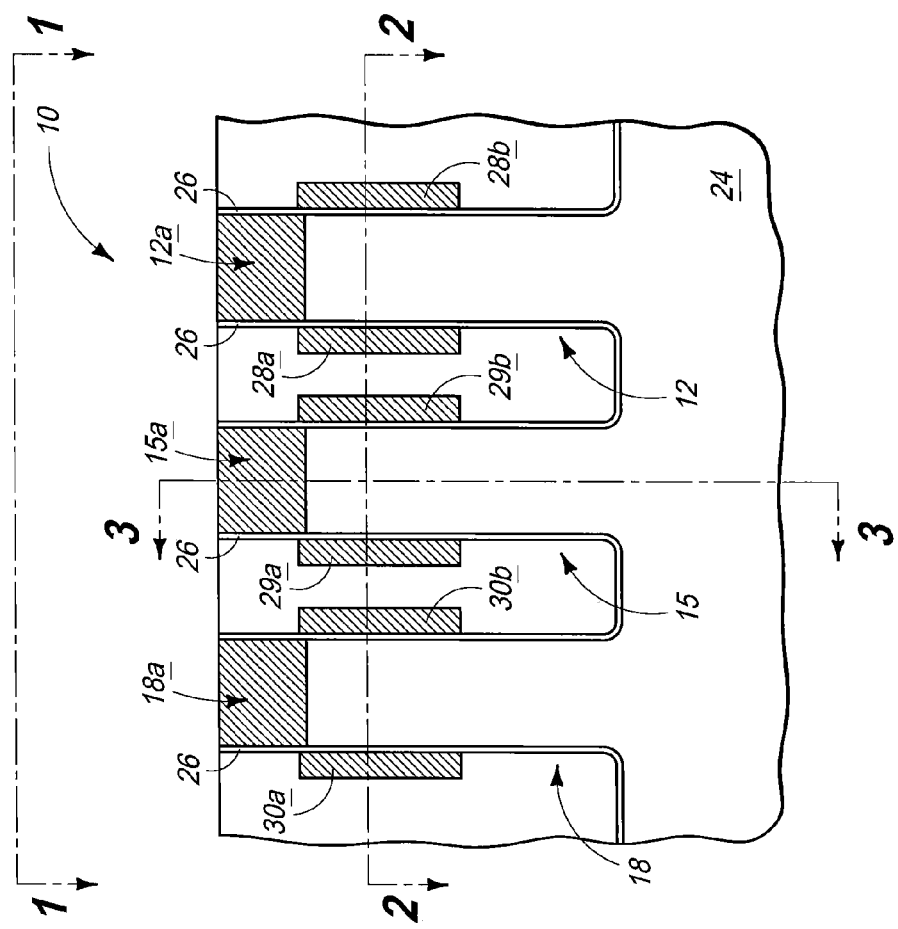
Figure 5:
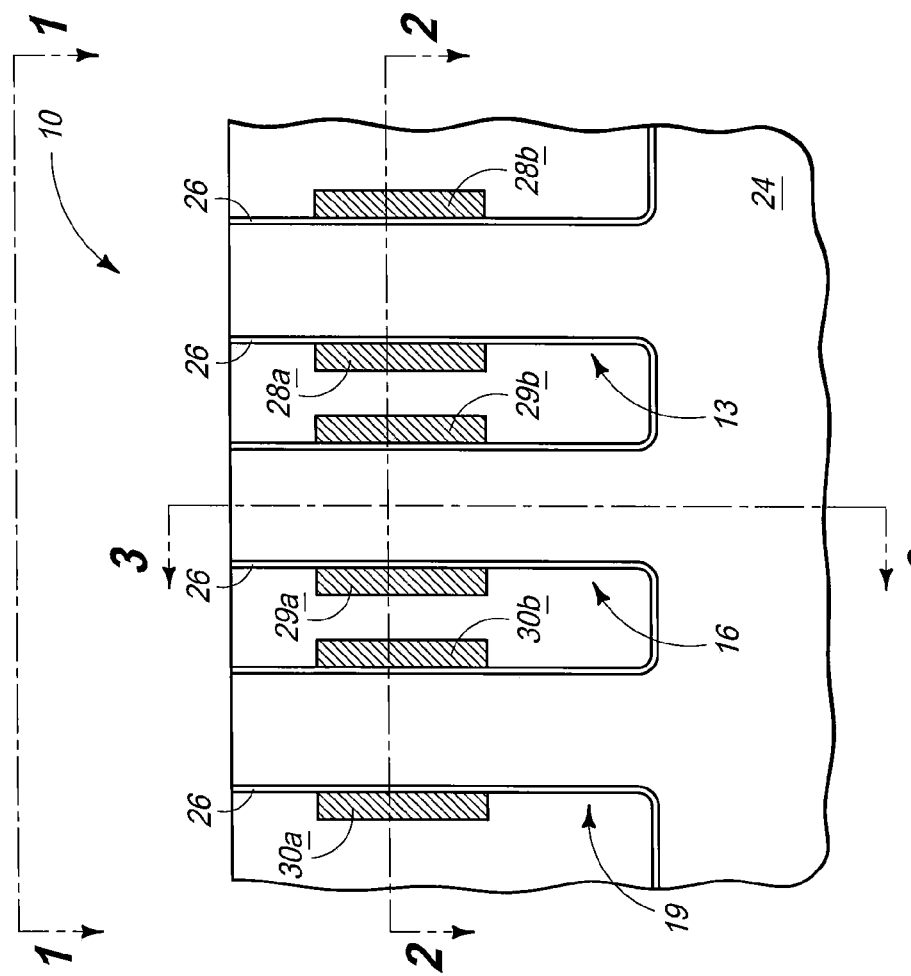

The projections 11, 12, 14, 15, 17 and 18 extend upwardly from a semiconductor substrate 24 (shown in FIGS. 3-5). Substrate 24 may comprise any suitable material; and in some embodiments may comprise, consist essentially of, or consist of monocrystalline silicon. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

In the shown embodiment in which the projections 11, 12, 14, 15, 17 and 18 are transistor projections, each projection is surrounded by gate dielectric material 26. Electrically conductive access lines 28-30 (shown in FIGS. 2-5) extend along the projections of rows 20-22, respectively, and are spaced from the semiconductor material of the projections by the gate dielectric material.

The gate dielectric material may comprise any suitable composition or combination of compositions; and in some embodiments may comprise, consist essentially of, or consist of one or both of silicon dioxide and silicon nitride.

The access lines may comprise any suitable composition or combination of compositions; and in some embodiments may comprise one or more of various metals (for instance, copper, titanium, aluminum, etc.), metal-containing materials (for instance, metal silicides, metal nitrides, etc.) and conductively-doped semiconductor materials (for instance, conductively-doped silicon, conductively-doped germanium, etc.).

Figure 2:
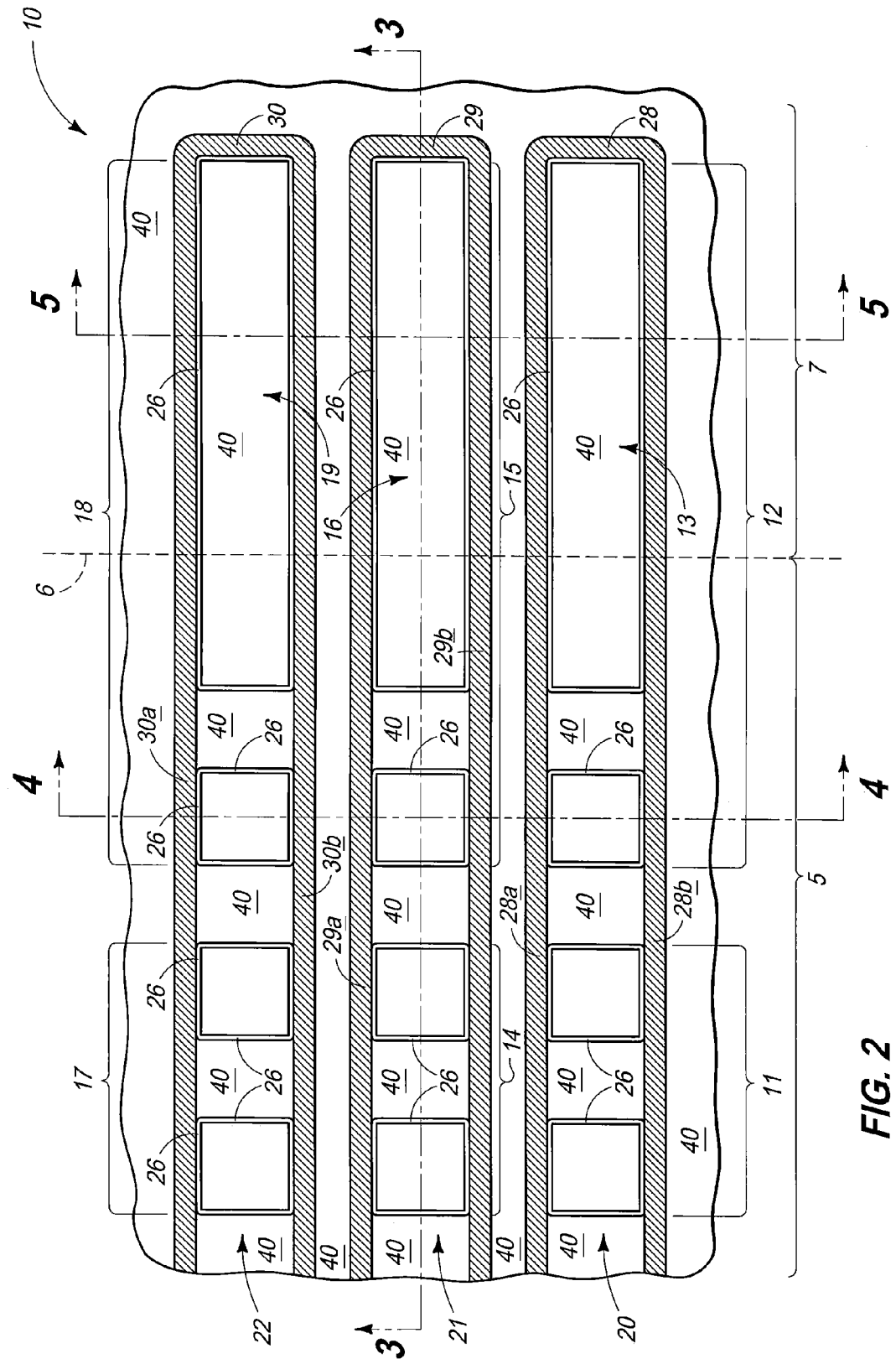

The electrically conductive lines 28-30 wrap around the ends of the terminal projections 12, 15 and 18 so that each of such electrically conductive lines effectively bifurcates into two branches that are on opposing sides of the projections 11, 12, 14, 15, 17 and 18 of the various rows (shown in FIG. 2). The branches of line 28 are labeled as 28a and 28b; and similarly the branches of lines 29 and 30 are labeled as 29a, 29b, 30a and 30b.

The access lines are primarily visible in FIGS. 2, 4 and 5, but a portion of line 29 is visible in FIG. 3. Also, a general location of branch 29b is diagrammatically illustrated with dashed-lines in FIG. 3 to assist the reader in visualizing the relative orientation of the access line to the various projections shown in the figure.

As indicated above, in some embodiments the construction of FIGS. 1-5 may ultimately be incorporated into a DRAM array. In such embodiments, some of the source/drain regions of the transistor projections may be electrically coupled to bitlines (which may also be referred to as sense lines), while others are electrically coupled to charge storage devices (such as capacitors). The coupling to the bitlines and to the charge storage devices may occur at any suitable processing stage. FIG. 3 diagrammatically illustrates coupling of various of the source/drain regions to bitlines 32 and 34, and to charge storage devices 36 and 38. Such coupling is diagrammatically illustrated in FIG. 3 to assist the reader in understanding the coupling that may ultimately occur in incorporating the transistor projections into a DRAM array. The coupling to the bitlines and/or to the charge storage devices may be present at the processing stage of FIGS. 1-5 in some embodiments, and may not be present at such processing stage in other embodiments.

The illustrated embodiment has dielectric material 40 formed over and between the various branches of access lines 28-30. Such dielectric material may comprise any suitable composition or combination of compositions, and in some embodiments may comprise one or more of silicon dioxide, silicon nitride, and various doped oxides (borophosphosilicate glass, phosphosilicate glass, etc.). Material 40 may be referred to as bulk dielectric material, in that it is present in a large quantity in the shown embodiment.

The construction of FIGS. 1-5 may be formed with any suitable processing, and is analogous to constructions known in the art. However, a difference between the construction of FIGS. 1-5 and at least some prior art constructions is that the electrically conductive lines 28-30 are formed to extend around the semiconductor material segments 13, 16 and 19 of the terminal semiconductor projections 12, 15 and 18.

Specifically, the prior art constructions would form dielectric material projections within the peripheral region, and would then have the lines 28-30 extend around such dielectric material projections. However, a problem encountered with such prior art constructions is that it can be difficult to form the dielectric material projections to the same tolerances as semiconductor material projections, and thus the various branches of the lines are relatively wavy and nonparallel in the peripheral region as compared to the memory array region. Ultimately, contacts are to be formed to the lines in the peripheral region. Wavy, nonparallel configurations of the lines can render it difficult to consistently form good quality contacts to all of the lines associated with a memory array.

The construction of FIGS. 1-5 can advantageously avoid the above-discussed prior art problem of wavy lines by utilizing semiconductor projections in the peripheral region, as well as in the memory array region, for aligning the various branches of the lines. In some embodiments, electrical contacts will ultimately be formed to extend into the peripheral segments 13, 16 and 19 of the terminal projections 12, 15 and 18. In such embodiments, the terminal projections may be considered to comprise contact locations where such electrical contacts will be formed.

The shown embodiment has conductively-doped regions 12b, 15b and 18b extending entirely across the terminal projections, and thus across the peripheral segments 13, 16 and 19 (for instance, the doped region 15b is shown extending across the peripheral segment 16 in the cross-sectional view of FIG. 3). In other embodiments, (not shown) such doped regions may not extend across the peripheral segments.

The rows 20-22 are described as having multiple projections of semiconductor material therein. In some embodiments, the projections may be referred to as "fins," particularly when the projections are long and narrow.

Figure 6:
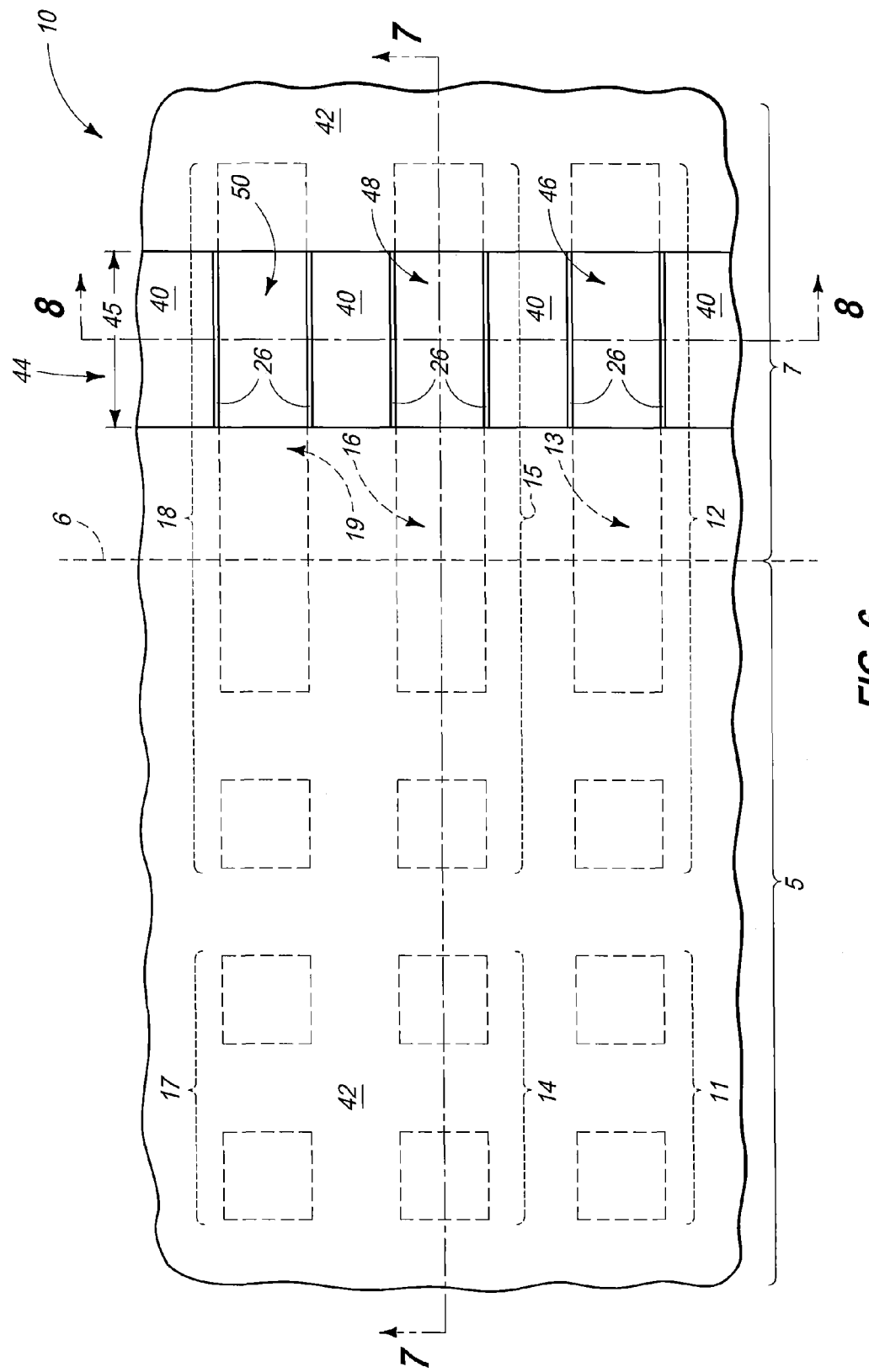
FIGS. 6-8 show the construction of FIGS. 1-5 at a processing stage subsequent to that of FIGS. 1-5.
Figure 7:
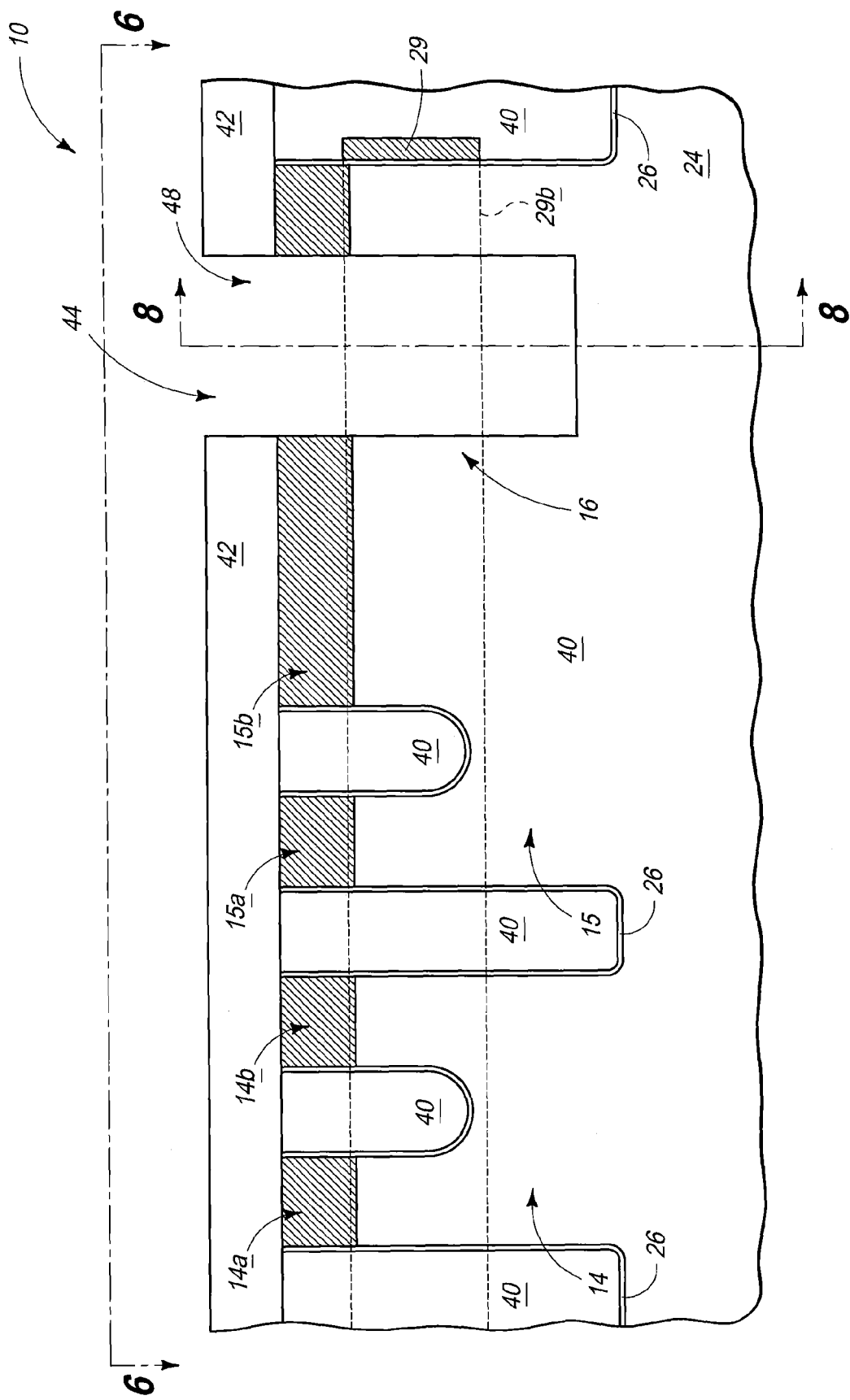
Figure 8:
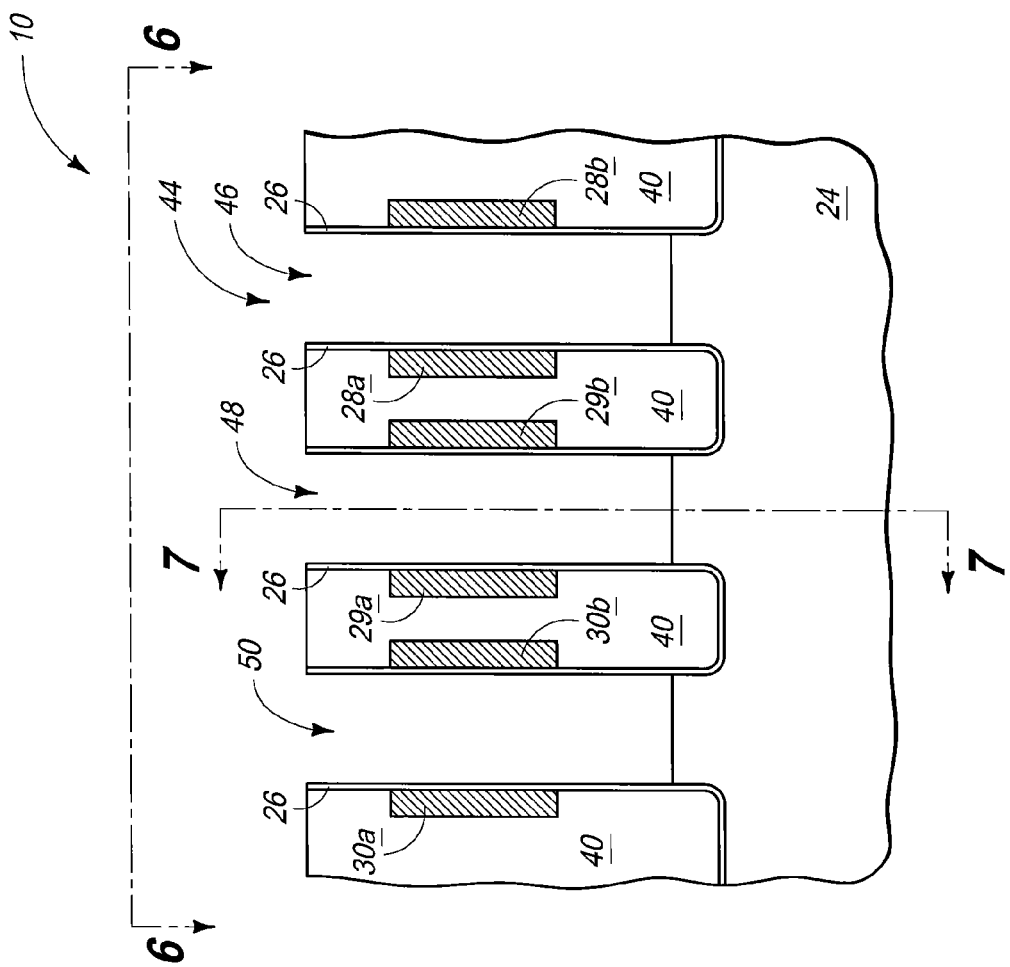

Referring next to FIGS. 6-8, a patterned masking material 42 is formed over projections 11, 12, 14, 15, 17 and 18, with such patterned material defining a slot 44 that overlaps regions of the peripheral segments 13, 16 and 19 of the projections.

Masking material 42 may comprise any suitable composition or combination of compositions; and in some embodiments may comprise, consist essentially of, or consist of photolithographically-patterned photoresist.

Projections 11, 12, 14, 15, 17 and 18 are shown in dashed-line view in FIG. 6 to indicate that such projections are beneath masking material 42.

The slot 44 exposes semiconductor material of the peripheral segments 13, 16 and 19, in addition to numerous other materials of construction 10. In subsequent processing, semiconductor material of peripheral segments 13, 16 and 19 is selectively removed relative to the various other materials to form tubs (or openings) 46, 48 and 50 extending into the peripheral segments 13, 16 and 19, respectively.

In the shown embodiment, the etching is selective for semiconductor material 24 relative to both the gate dielectric material 26 and the bulk dielectric material 40. In other embodiments, the etching may be selective only to the bulk dielectric material 40. For purposes of interpreting this disclosure and the claims that follow, an etch is considered to be selective for a first material relative to a second material if it removes the first material at a faster rate than the second material, which includes, but is not limited to, etches which are 100% selective for the first material relative to the second material. The shown example embodiment may comprise selective removal of silicon relative to silicon dioxide, and may utilize HBr.

In some embodiments, the selectivity of the etch for the semiconductor material 24 may be enhanced by implanting dopant through slot 44 and into the semiconductor material of the peripheral segments 13, 16 and 19 prior to the etch.

The tubs formed by removing the semiconductor material of the peripheral segments 13, 16 and 19 may be any suitable depth. In the shown embodiment of FIG. 8, the tubs extend to a depth below the lowestmost surfaces of the branches 28a, 28b, 29a, 29b, 30a and 30b of the electrically conductive access lines.

The slot 44 may be formed to be any suitable size and shape. In the shown configuration, the slot has a width 45. In some embodiments, such width may be from about 90 nm to about 200 nm.

The illustrated slot exposes interior regions of the peripheral segments 13, 16 and 19. In other embodiments, the slot may be offset relative to the peripheral segments to expose the ends of the peripheral segments 13, 16 and 19; and in some embodiments the slot may be directly over the lines wrapping around the peripheral segments—with such lines being visible in the view of FIG. 2.

Figure 9:
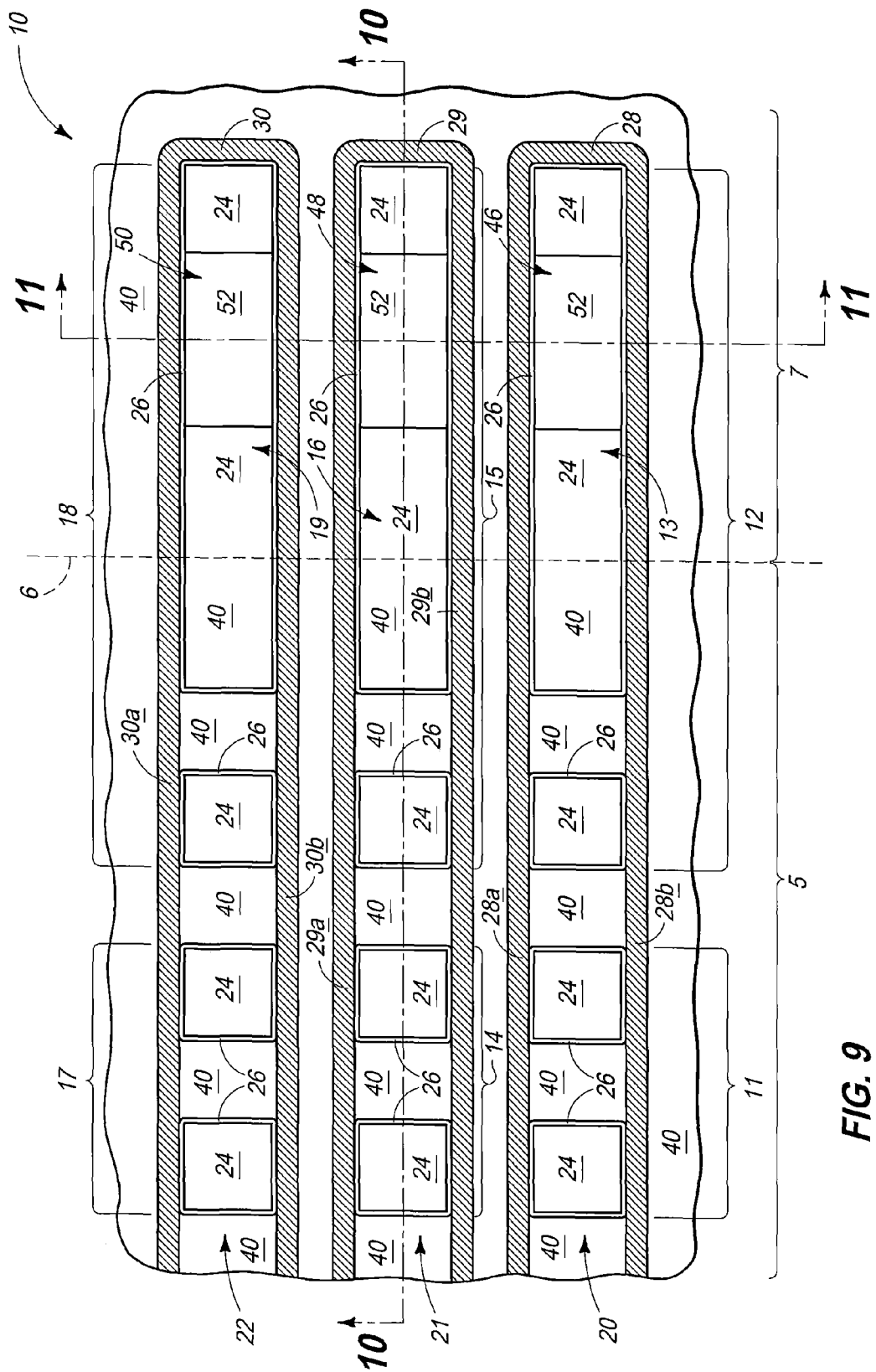
FIGS. 9-11 show the construction of FIGS. 1-5 at a processing stage subsequent to that of FIGS. 6-8.
Figure 10:
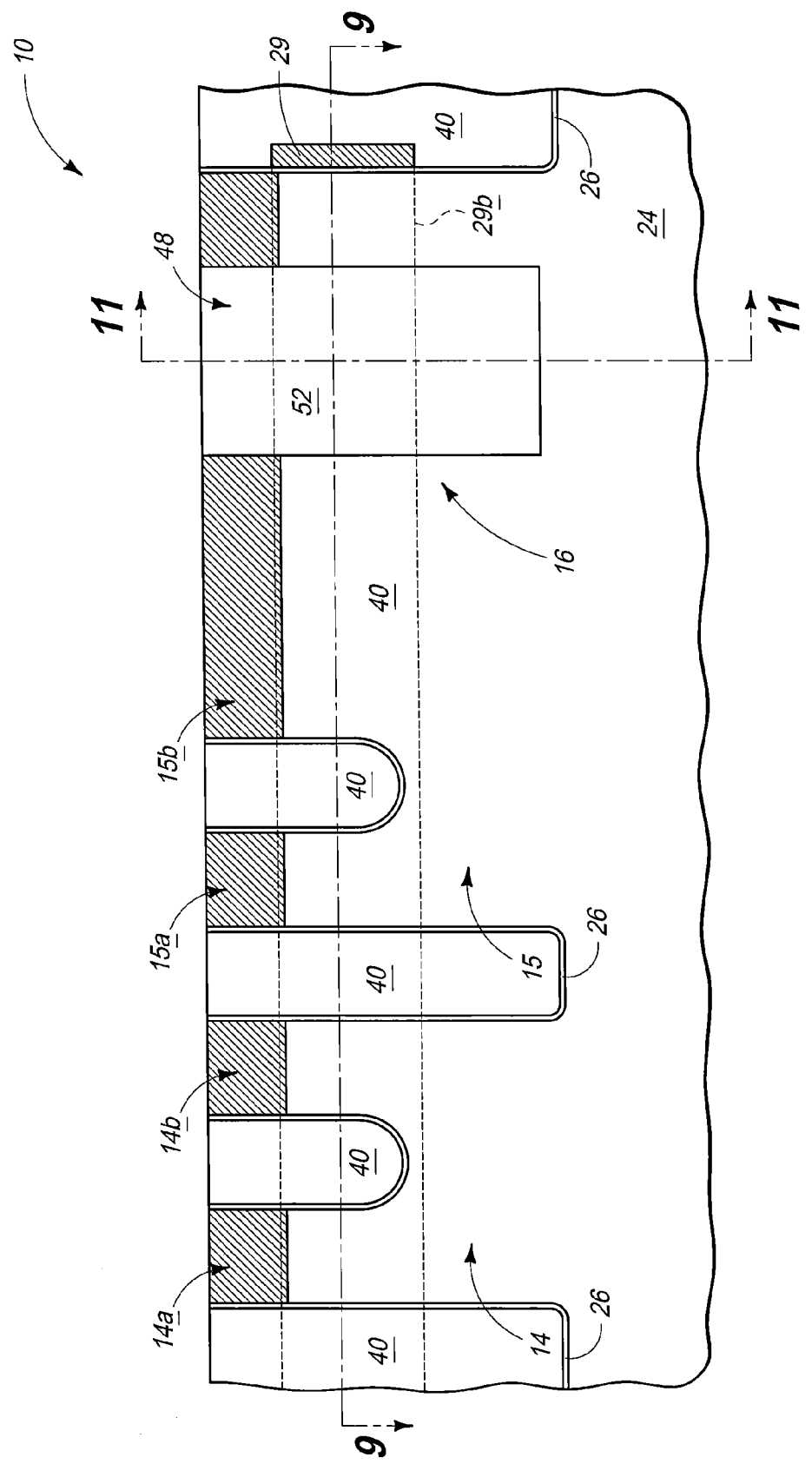
Figure 11:
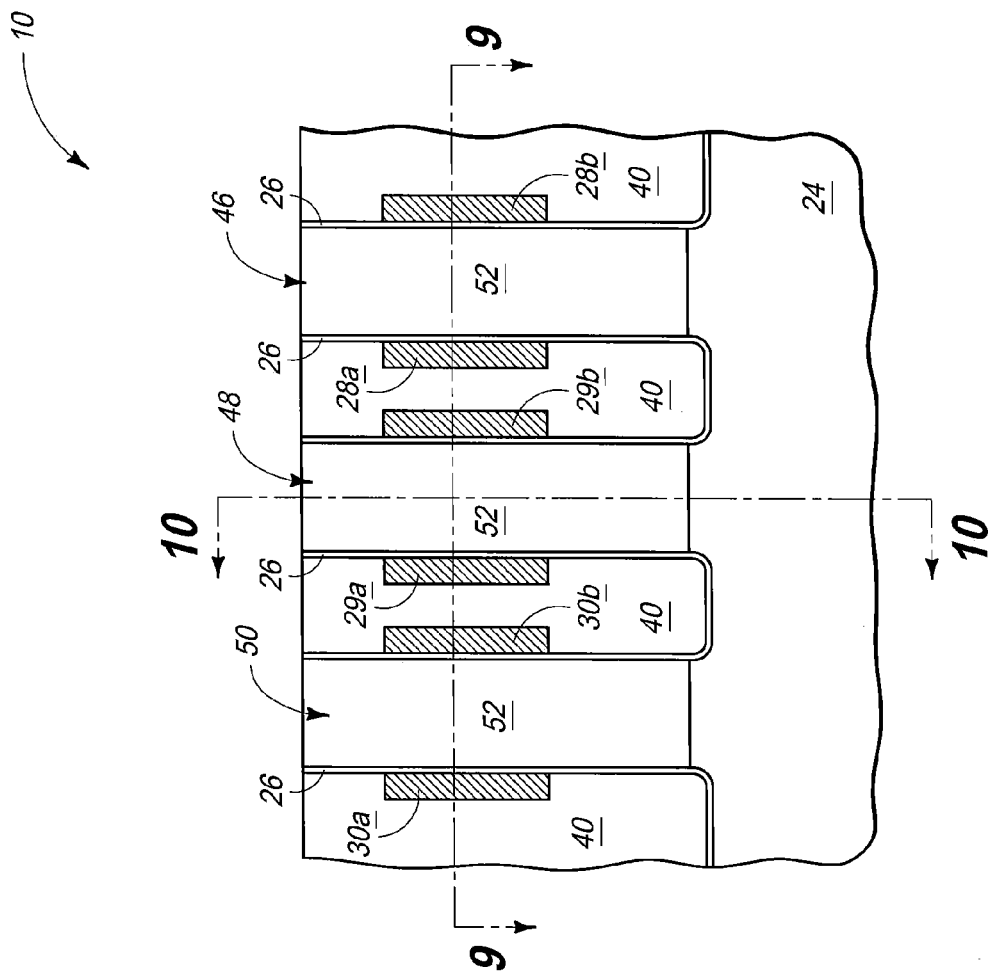

Referring next to FIGS. 9-11, masking material 42 (FIGS. 6-8) is removed, and the tubs 46, 48 and 50 are filled with dielectric material. In the shown embodiment, the tubs are filled with a homogeneous dielectric material 52, but in other embodiments the tubs may be filled with multiple different dielectric materials. The dielectric material utilized to fill the tubs may comprise any suitable composition, and in some embodiments may comprise one or more of silicon dioxide, silicon nitride, and any of various doped oxides.

The dielectric material may be formed within the tubs utilizing any suitable processing. For instance, the dielectric material may be formed utilizing one or both of atomic layer deposition (ALD) and chemical vapor deposition (CVD). The dielectric material may be formed to overfill the openings in some embodiments, and then the overfill may be removed utilizing chemical-mechanical polishing (CMP) or any other suitable methodology.

In some embodiments, the dielectric material 52 formed within the tubs 46, 48 and 50 may be considered to replace semiconductor material that had originally been present in the peripheral segments 13, 16 and 19 of the projections 12, 16 and 18. In some embodiments, the portions of the conductive lines 28-30 that extend along the terminal segments 13, 16 and 19 (for instance, the portion of branch 29b illustrated in FIG. 10 as being along the terminal segment 16) may be considered to each comprise two sections, with one of the sections being along the semiconductor material 24 remaining in the terminal segments, and with the other of the sections being along the dielectric material 52.

Figure 12:
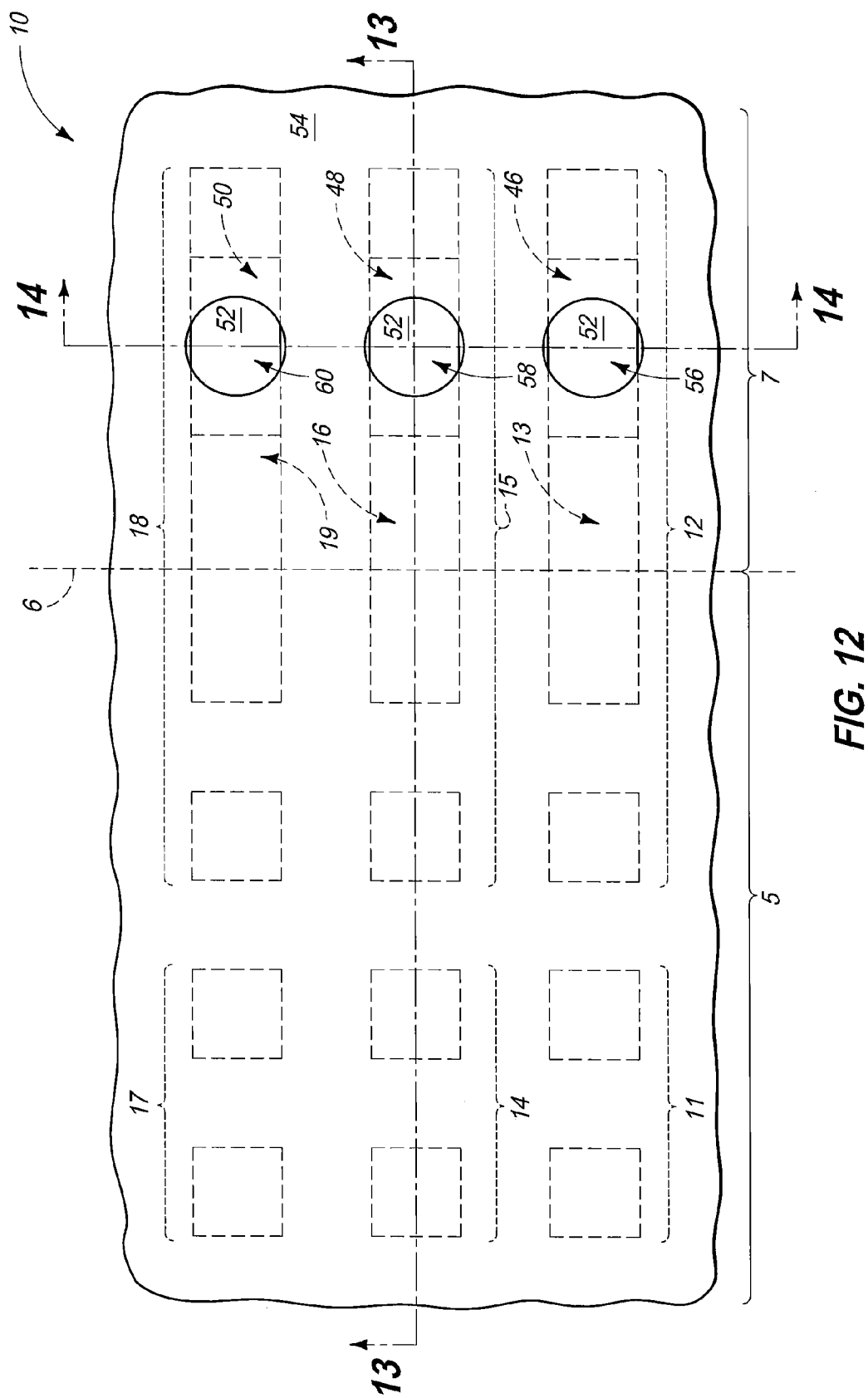
FIGS. 12-14 show the construction of FIGS. 1-5 at a processing stage subsequent to that of FIGS. 9-11.
Figure 13:
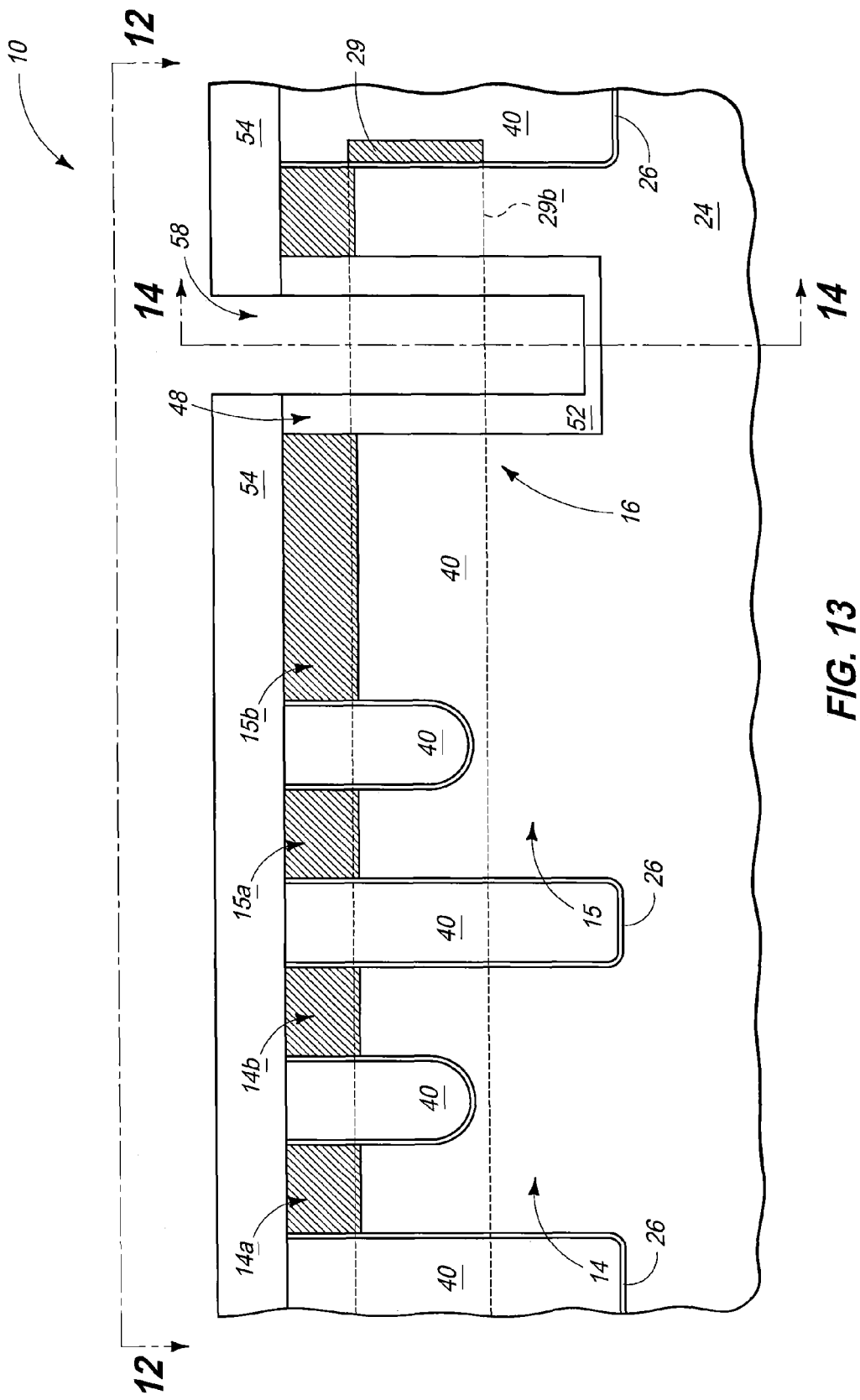
Figure 14:
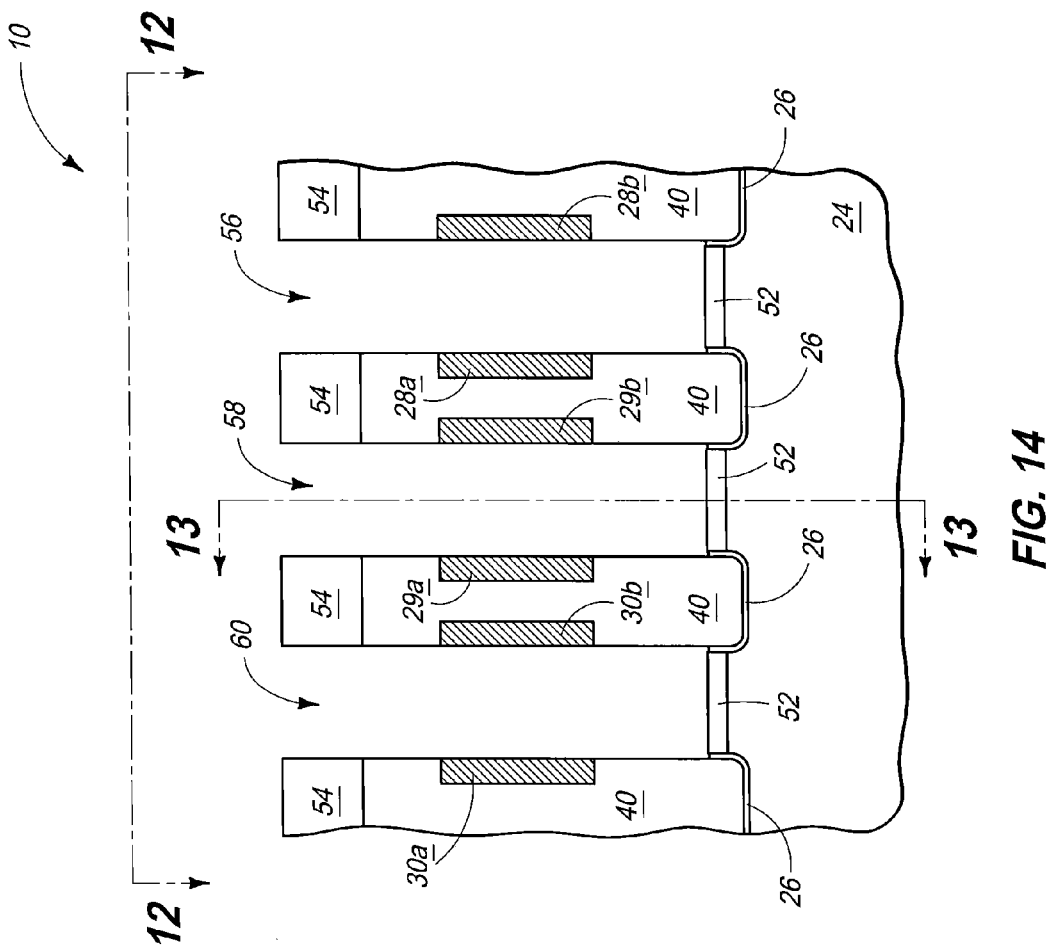

Referring next to FIGS. 12-14, patterned masking material 54 is formed over projections 11, 12, 14, 15, 17 and 18, with such patterned material defining a plurality of openings 56, 58 and 60 that overlap regions of the dielectric material 52 within tubs 46, 48 and 50.

Masking material 54 may comprise any suitable composition or combination of compositions; and in some embodiments may comprise, consist essentially of, or consist of photolithographically-patterned photoresist.

Openings 56, 58 and 60 are extended into dielectric material 52 with one or more suitable etches. Such etches also remove gate dielectric material 26 from within the openings, and thus expose branches 28a, 28b, 29a, 29b, 30a and 30b of the electrically conductive access lines (as shown in FIG. 14).

In the shown embodiment, the openings are provided in locations so that they expose both branches of the respective lines (for instance, opening 60 exposes both of the branches 30a and 30b of line 30). In other embodiments, the openings may be misaligned, and the embodiments described herein may compensate for the misalignment by still enabling one of the branches of an electrically conductive line to be exposed within a misaligned opening. In yet other embodiments, one or more of the openings 56, 58 and 60 may be purposefully aligned to only expose one of the branches of an electrically conductive line and/or to expose a terminal region of an electrically conductive line along a terminal end of one or more of the peripheral segments 13, 16, and 19.

The openings 56, 58 and 60 may be formed to any suitable depth. In the shown embodiment, the openings extend to a depth below the lowestmost surfaces of the conductive lines 28, 29 and 30, but in other embodiments the openings may extend to a depth which exposes the conductive lines without extending to beneath the lines.

The exposed regions of the electrical conductive lines 28-30 are ultimately connected to electrical contacts (as discussed below with reference to FIGS. 15-17). In some embodiments, dopant may be implanted into the exposed regions of the electrically conductive lines to improve electrical conduction across an interface of the electrically conductive lines and the electrical contacts. Such dopant may be implanted into openings 56, 58 and 60.

Figure 15:
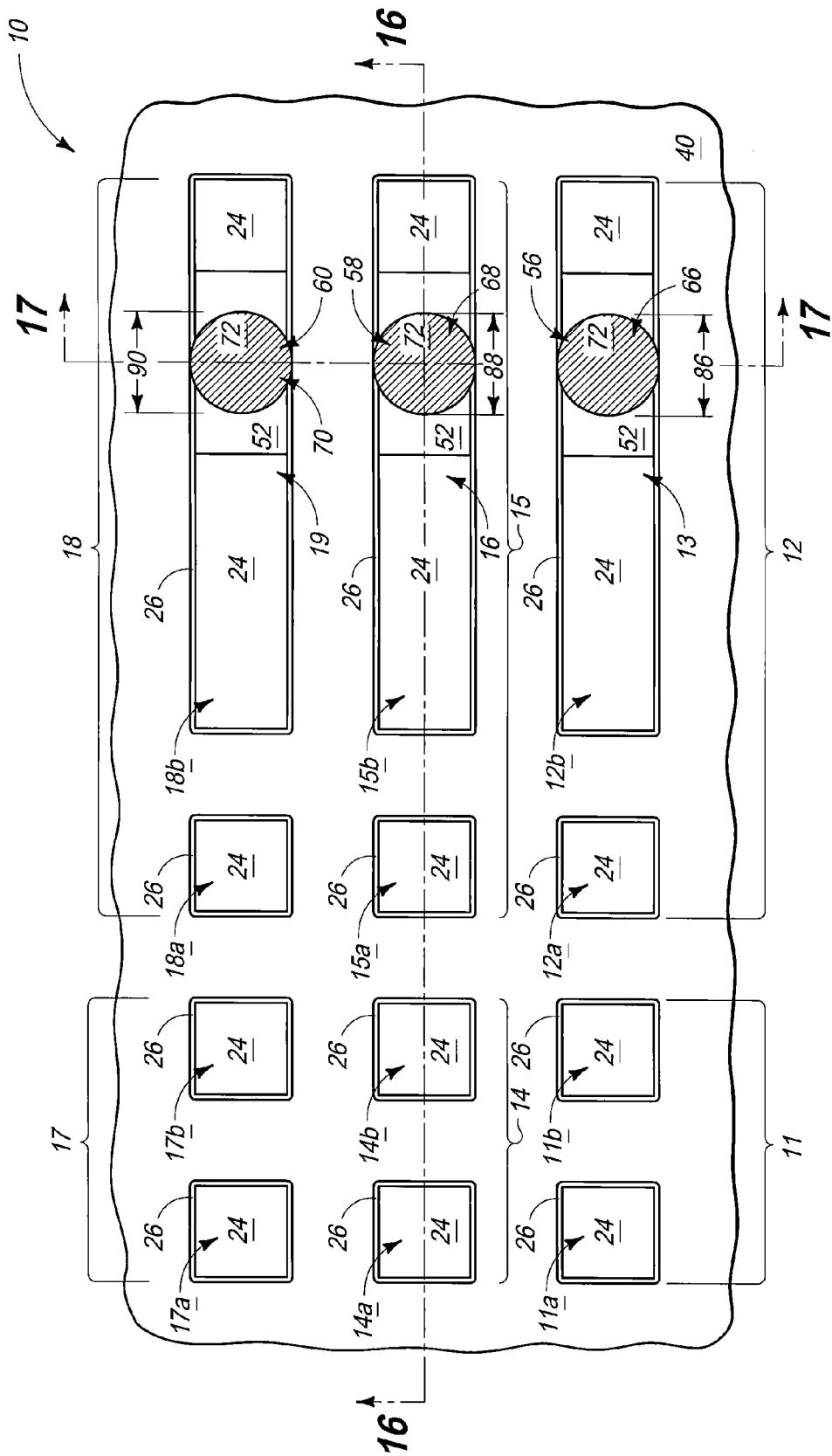
FIGS. 15-17 show the construction of FIGS. 1-5 at a processing stage subsequent to that of FIGS. 12-14.
Figure 16:
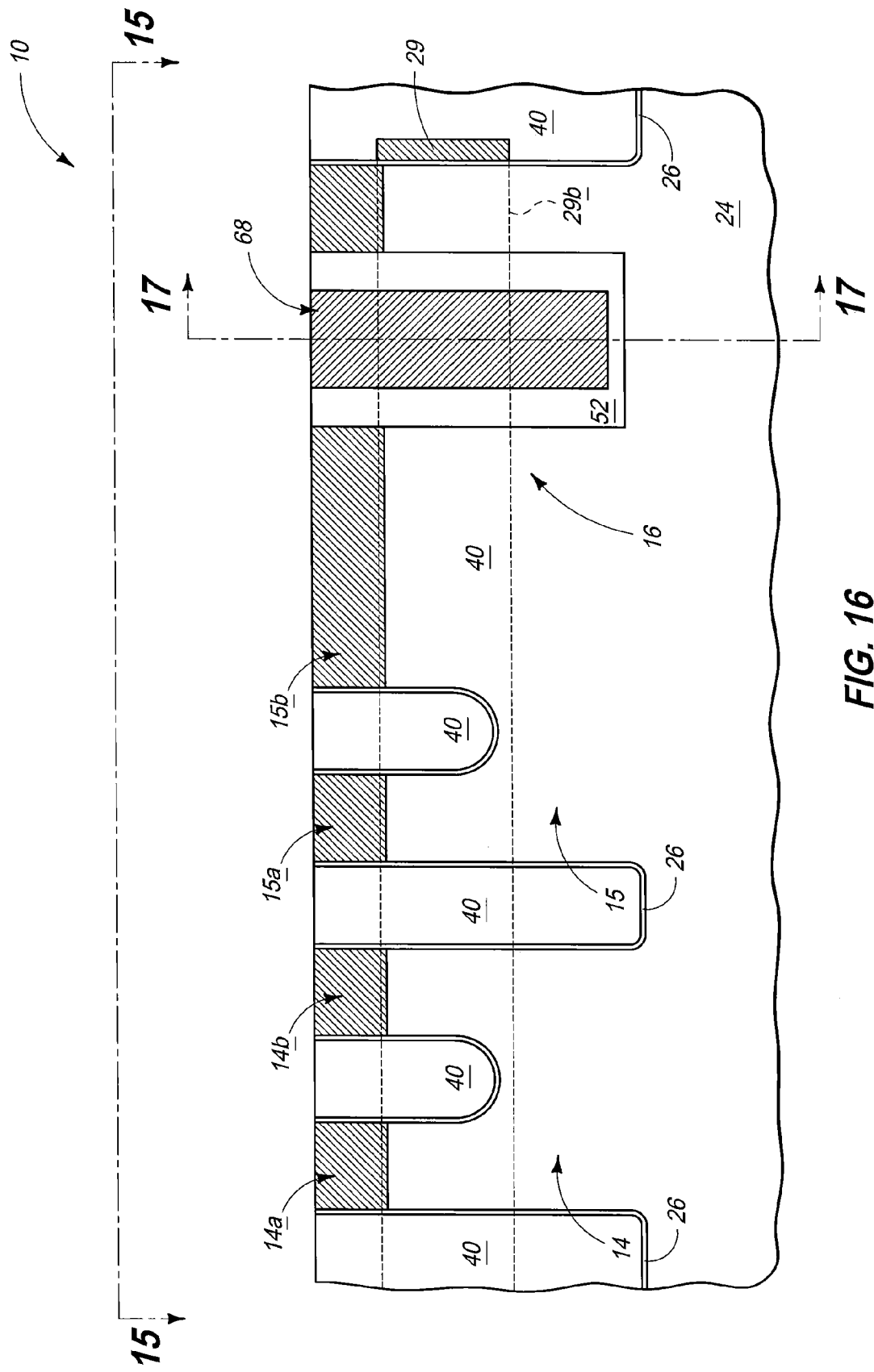
Figure 17:
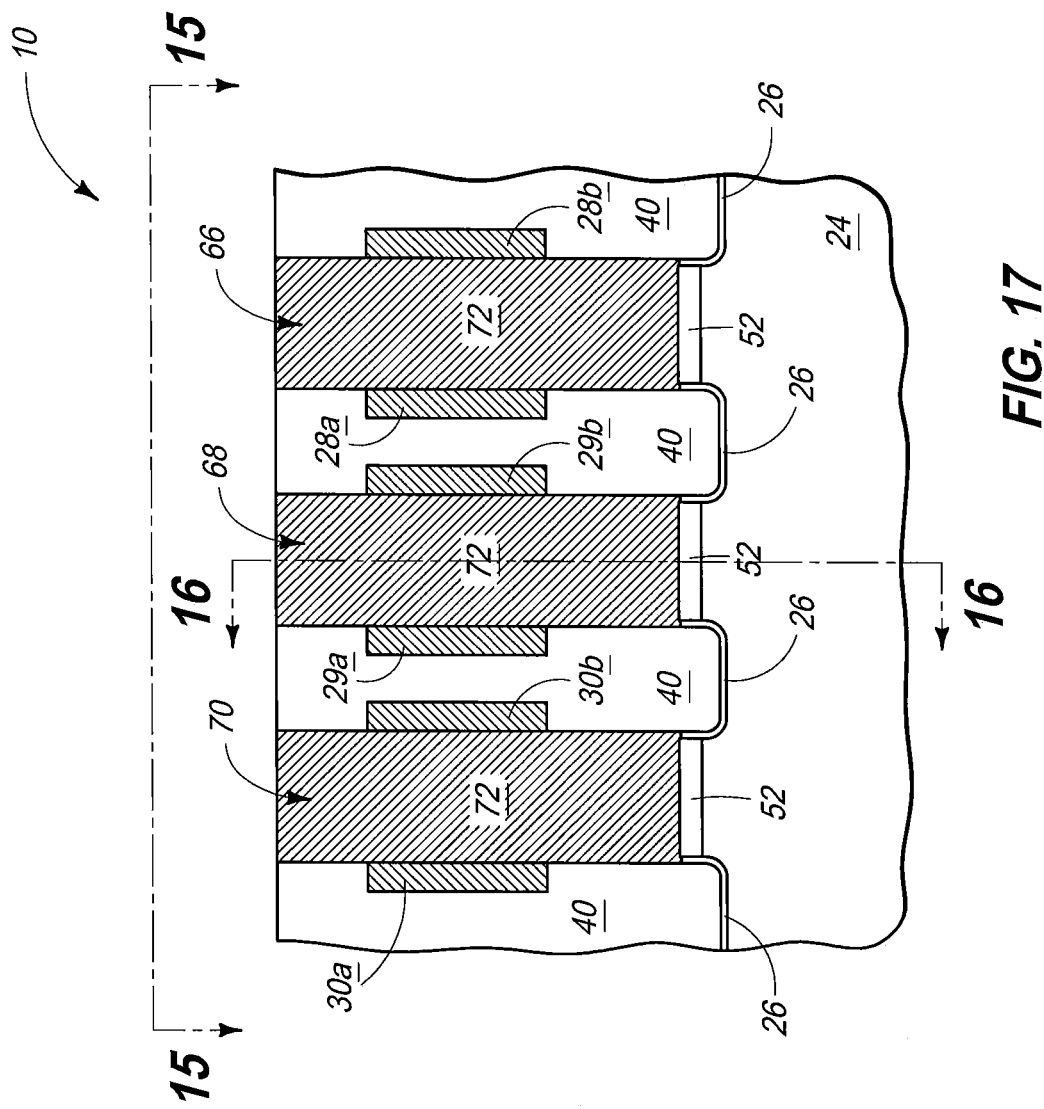

Referring next to FIGS. 15-17, masking material 54 (FIGS. 11-14) is removed, and electrical contacts 66, 68 and 70 are formed within the openings 56, 58 and 60, respectively.

The electrical contacts comprise electrical conductive material 72. Such electrically conductive material may comprise any suitable composition or combination of compositions; and in some embodiments may comprise one or more of various metals, metal-containing materials, and conductively-doped semiconductor materials. Although material 72 is shown to be homogeneous, in other embodiments the material may comprise two or more discrete compositions.

The material 72 may be formed utilizing any suitable processing, including, for example, one or more of ALD, CVD and physical vapor deposition (PVD). In some embodiments, material 72 may be formed to overfill openings 56, 58 and 60, and then CMP or any other suitable processing may be utilized to remove excess material 72 and form the construction of FIGS. 15-17.

The contacts 66, 68 and 70 make electrical connection to lines 28, 29 and 30, respectively. In the shown embodiment, each of the contacts is directly against both branches of a respective line (for instance, contact 66 is directly against both branches 28a and 28b of line 28 as can be seen in FIG. 17). The contacts may be formed to any suitable depths, and in the shown embodiment extend entirely across the full vertical dimensions of lines 28-30. In other embodiments, the contacts may extend to only the upper regions of the lines 28-30.

In the shown embodiment, the contacts 66, 68 and 70 have widths 86, 88 and 90, respectively. Such widths are about the same as one another in the shown embodiment. In example embodiments, the widths of the contacts may be about 50 nm. In some embodiments, an average width of the contacts will be less than or equal to about one-third of a width of the slot 44 (FIG. 6), which leaves plenty of margin for possible mask misalignment (relative to the width of the slot) during formation of the openings 56, 58 and 60 (FIG. 12) utilized for patterning the contacts.

In some embodiments, dielectric materials 26 and 52 may be referred to as first and second dielectric materials, respectively. The dielectric material 52 may comprise a different composition than the dielectric material 26 in some embodiments. For instance, material 26 may be a gate oxide, and may, for example, consist of silicon dioxide. In contrast, dielectric material 52 may be a doped oxide, such as borophosphosilicate glass. FIG. 17 shows that the dielectric materials 26 and 52 may contact one another in finished constructions of some embodiments.

Although the embodiment described herein forms contacts to access lines (i.e., wordlines), persons of ordinary skill in the art will recognize that analogous processing may be utilized to form contacts to sense lines (i.e., bitlines).

The various arrays and devices discussed above may be incorporated into electronic systems. Such electronic systems may be used in, for example, memory modules, device drivers, power modules, communication modems, processor modules, and application-specific modules, and may include multilayer, multichip modules. The electronic systems may be used in any of a broad range of electronics, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
    projections supported by a substrate; the projections being arranged in rows, with terminal projections of each row being elongated projections;
    conductive lines along the rows of projections, each of the electrically conductive lines wrapping around ends of the elongated projections and bifurcating into two branches that are along opposing sides of the elongated projections; each of the elongated projections comprising a dielectric region laterally between a pair of semiconductor material regions; the two branches along the opposing sides of each elongated projection having first sections along the semiconductor material regions, and having second sections along the dielectric region; and
    conductive material extending into the dielectric regions of the elongated projections; the conductive material within each elongated projection being directly against the two branches along the opposing sides of the elongated projection.

2. The memory array of claim 1 wherein the conductive material joins with the two branches at interfaces, and wherein said interfaces comprise doped regions of the two branches.

3. The memory array of claim 1 wherein the two branches have lowermost surfaces, and wherein the dielectric regions have lowermost surfaces deeper than the lowermost surfaces of the two branches.

4. A memory array, comprising:
    rows of projections extending upwardly from a monocrystalline silicon-containing substrate; the projections being semiconductor material projections comprising transistor channel regions; terminal semiconductor projections of each row being elongated projections;
    conductive lines along the rows of projections, each conductive line wrapping around an end of an elongated projection and bifurcating into two branches that are along opposing sides of the elongated projection; the electrically conductive lines being spaced from the elongated projections by first dielectric material;
    second dielectric material within the elongated projections, and directly against the first dielectric material, the second dielectric material being compositionally different from the first dielectric material; and conductive contacts extending through the second dielectric material; each conductive contact being directly against the two branches along the opposing sides of an elongated projection.

5. The memory array of claim 4 wherein the conductive contacts join with the two branches at interfaces, and wherein said interfaces comprise doped regions of the two branches.

6. The memory array of claim 4 wherein the two branches have lowermost surfaces, and wherein the second dielectric material extends to a level beneath the lowermost surfaces of the two branches.

7. The memory array of claim 4 wherein the semiconductor material projections comprise silicon.

8. A memory array, comprising:

rows of semiconductor material projections supported by a monocrystalline silicon-containing substrate; terminal semiconductor projections of each row being elongated projections;

electrically conductive lines along the rows of semiconductor material projections, individual of the electrically conductive lines wrapping around ends of the elongated projections and bifurcating into two branches that are along opposing sides of the elongated projection and the semiconductor material projections of each row; the electrically conductive lines being spaced from the projections by first dielectric material;

second dielectric material within the elongated projections, and directly against the first dielectric material, the second dielectric material being compositionally different from the first dielectric material; and electrically conductive structures extending through the second dielectric material; each of the electrically conductive structures being directly against the two branches along the opposing sides of an elongated projection.

* * * * *